Sept. 22, 1970 B. E. SEAR 3,530,411

HIGH FREQUENCY ELECTRONIC CIRCUIT STRUCTURE EMPLOYING PLANAR TRANSMISSION LINES

Original Filed Aug. 30, 1966 2 Sheets-Sheet 1

BRIAN E. SEAR
INVENTOR.

BY

Roger A. Marro.

Sept. 22, 1970 B. E. SEAR 3,530,411

HIGH FREQUENCY ELECTRONIC CIRCUIT STRUCTURE EMPLOYING PLANAR TRANSMISSION LINES

Original Filed Aug. 30, 1966 2 Sheets-Sheet 2

BRIAN E. SEAR
INVENTOR.

BY

Roger A. Marro.

United States Patent Office 3,530,411

Patented Sept. 22, 1970

3,530,411

HIGH FREQUENCY ELECTRONIC CIRCUIT STRUCTURE EMPLOYING PLANAR TRANSMISSION LINES

Brian E. Sear, Canoga Park, Calif., assignor to The Bunker-Ramo Corporation, Stamford, Conn., a corporation of Delaware Continuation of application Ser. No. 576,099, Aug. 30, 1966. This application Feb. 10, 1969, Ser. No. 800,038

Int. Cl. H01p 3/06, 7/04; H01q 5/24

U.S. Cl. 333—96 12 Claims

ABSTRACT OF THE DISCLOSURE

A structure forming a high frequency electronic circuit comprised of both active and reactance components. The structure is comprised of one or more electrically conductive plates secured together to define a composite electrically conductive board structure. Planar coaxial transmission lines extend through the board structure defining inductive components and establishing circuit interconnections. Each transmission line is comprised of a conductor supported by dielectric material within a channel extending through the board structure. Active components are also supported within recesses defined within the board structure. Adjustable capacitive components are formed by movable plugs which extend into holes formed in the board structure.

This application is a continuation of my application Ser. No. 576,099, filed Aug. 30, 1966, and now abandoned.

This invention relates in general to planar electrical circuitry and in particular to planar circuitry useful for high frequency transmission lines.

In recent years, there has been an increasing emphasis on microminiaturization of electronic equipment and circuits. In the past few decades, moreover, substantial changes have taken place in the techniques of circuit board construction. The typical modern day circuit board uses laminated plastics or ceramic materials as an insulating and supporting member upon which conductive circuitry is placed either by selective deposition of a film pattern or by deposition of a conductive film followed by selective etching techniques. Typically, the laminated printed circuits are manufactured through a process in which a circuit pattern or network is delineated by using a photo-resist on the face of a preformed insulating sheet having a metal surface bonded thereto. The portion of the metal surface which is not covered by the photo-resist pattern is subsequently etched away to yield the desired conductive pattern of the insulating board surface.

While these techniques are sufficiently sophisticated where the characteristics of the interconnection means are of little importance, i.e., when used with relatively low frequency signals, these techniques have been found to be impractical where the characteristics of the interconnection means can have a pronounced effect on system performance, i.e., where the transient durations of the signals become a significant fraction of the time required to propagate the signals between circuits or components thereof. In such cases, the interconnecting means must be regarded as a distributed circuit element and, where the signal propagation time is significant, the interconnection means must be viewed as a transmission line and transmission line theory must be applied to achieve proper circuit and system designs.

Since the interconnection means must be viewed as a transmission line, certain properties of the interconnection means must be carefully controlled, such as uniformity, proper termination, and isolation against crosstalk. Variations in uniformity may appear as changes in the characteristic impedance resulting in signal reflections; such signal reflections can also arise from improper termination characteristics. Crosstalk problems, resulting from coupling between adjacent circuits, become significant in high speed circuitry because of the rates of change in the electric and magnetic fields during transients; such problems also become significant when high frequency signals are used such as in RF circuitry. These problems, of course, become of special importance when high interconnection densities are involved for compatibility with microminiaturization afforded by integrated circuits. In view of the foregoing consideration, various attempts have been made in the prior art to develop techniques for interconnecting high speed or RF circuits. Some of these techniques are discussed in U.S. patent application, Ser. No. 430,321, filed on Feb. 4, 1965 (now U.S. Pat. No. 3,351,816) and assigned to the same assignee as the present application. The cited patent application discloses an improved means suitable for interconnecting high speed or RF circuits together with a method of fabricating such interconnection means.

More particularly, the cited patent application discloses an interconnection technique which involves providing planar coaxial interconnection between components and circuits. The interconnection means are formed, according to a preferred embodiment of the disclosed invention, by etching troughs in opposing surfaces of conductive ground plates, formed of aluminum, for example. Epoxy is deposited in each of the troughs and a conductor is then formed on the surface of the epoxy in one of the troughs. A conductive bonding material, such as a metal loaded epoxy, is then deposited on the opposed surfaces of the aluminum plate. A nonconductive epoxy is deposited opposite to the conductor on the epoxy in the trough. The two plates are then laminated together by the application of heat and pressure.

An interconnection structure constructed in accordance with the teaching of the cited patent application possesses characteristics which make it extremely attractive for the contemplated applications. The structure provides uniform self-shielded transmission lines and a continuous range of characteristic impedances can be obtained as a function of the geometry of the troughs and the width of the conductors. High interconnection densities with negligible crosstalk can be achieved making this approach compatible with packing densities afforded by integrated circuits.

In view of the foregoing comments, it is apaprent that there is a great desire to be able to produce RF circuitry by means of printed circuit techniques. As is well known, however, certain aspects of RF circuitry have not in the past been particularly amenable to printed circuit techniques. One such type of circuit, for example, is an RF amplifier having a double tuned input and output. As is well known, such an RF amplifier, which normally uses transformers and inductances to achieve tuning and decoupling, can be manufactured using quarter wavelength resonators, such quarter wavelength resonators including tuning capacitors as one of the elements. Because of the length of the quarter wavelength resonators, circuit boards of the prior art have been unnecessarily large and cumbersome. In addition, tuning capacitors had to appear as discrete circuit elements mounted on the surface of the board with the leads from such capacitors being coupled in some fashion to the RF conductors. This type of hybrid configuration led to problems of leakage, crosstalk, and distortions due to line nonuniformity and improper length.

Applicant has succeeded in overcoming the disadvantages of the prior art configurations by providing a planar coaxial printed circuit board in which the transmission lines employed in the quarter wavelength resonators can be folded in various configurations to achieve compactness and greater density and in which the tuning capacitors are fabricated along with and built integrally into the circuit board itself.

Therefore, the present invention provides a printed circuit board capable of use in RF circuitry in which quarter wavelength transmission lines can be compactly configured and in which tuning capacitors are integral with the printed circuit structure. The physical size of the printed circuit board is greatly reduced by placing the quarter wavelength transmission lines suitable for RF circuitry in a folded planar coaxial configuration. Also, the present invention provides a novel method of manufacturing a tunable capacitor currently with a printed circuit configuration.

Other objects and advantages of the present invention will become more readily apparent from the following detailed description of the unique structure and novel fabrication techniques provided for by the present invention. It should be noted, however, that the following detailed description and the accompanying drawings are merely intended as illustrative of the invention and not as a limitation thereon. Furthermore, in the following drawings, reference numerals shall be carried forward where applicable to designate like parts of the invention. The invention itself will be best understood when read in connection with the accompanying drawings, in which:

Figure 1:
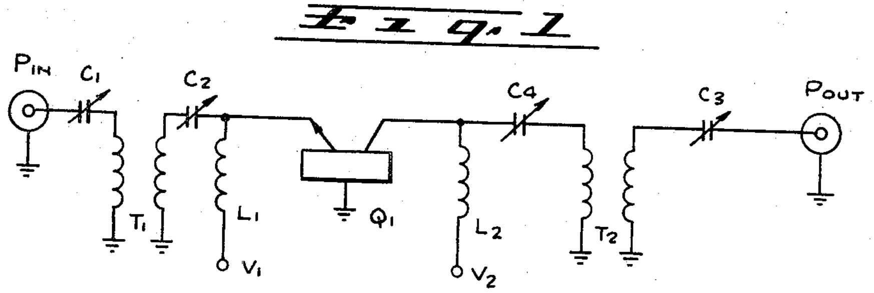
FIG. 1 is a circuit diagram of a typical RF amplifier utilizing lumped circuit components.

An example of a conventional double tuned input and output RF amplifier is shown in FIG. 1. The input terminal $P_{in}$ is coupled by variable capacitor C1 to the primary winding of a transformer T1. The secondary winding of the transformer T1 is coupled to a variable capacitor C2 to an inductor L1 and to the emitter of a transistor Q1. The inductor L1 is connected to a terminal at voltage V1 which serves to bias the emitter of the transistor Q1 negatively. The collector of the transistor Q1 is coupled to a positive voltage source V2 by an inductor L2 and to the primary winding of a transformer T2 by a variable capacitor C4. The secondary winding of the transformer T2 is coupled to the output terminal $P_{out}$ by a variable capacitor C3.

In operation, the variable capacitors C1 and C2 in conjunction with the transformer T1 act as two narrow band filters which allow only signals of a particular frequency to pass to the emitter of the transistor Q1. In a like fashion, the capacitors C4 and C3 in conjunction with transformer T2 act to allow only a particular signal frequency issuing from the emitter of the transistor Q1 to pass to the output terminal $P_{out}$. Inductors L1 and L2 act to decouple the DC voltages at V1 and V2 from the AC signals in the remainder of the circuit.

Figure 2:
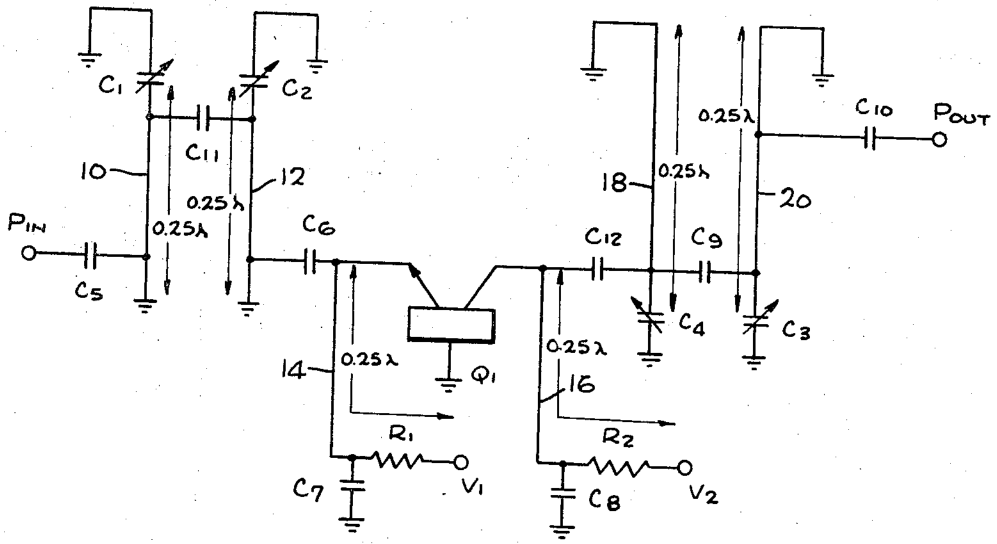
FIG. 2 is an equivalent circuit diagram of the RF amplifier of FIG. 1 utilizing quarter wavelength resonators.

A direct equivalent of the circuit illustrated in FIG. 1 can be obtained by using quarter wavelength resonators as shown in FIG. 2. Terminal $P_{in}$ is coupled to strip transmission line 10 by means of capacitor C5. One end of the strip transmission line 10 is connected to ground; the other end is also connected to ground through variable capacitor C1. Strip transmission line 10 is quarter wavelength in length between ground and the variable capacitor C1. Strip transmission line 10 is connected to a second quarter wavelength strip transmission line 12 by means of capacitor C11. The strip transmission line 12 is coupled to ground directly at one end and through variable capacitor C2 at the other end. The strip transmission line 12 is coupled to the emitter of transistor Q1 by means of capacitor C6. The emitter of the transistor Q1 is coupled to a voltage source V1 by means of quarter wavelength strip transmission line 14 which has therein a resistor R1 and a capacitor C7 coupled to ground. The base of the transistor Q1 is also coupled to ground.

In a like fashion, the collector of the transistor Q1 is connected to a voltage source V2 by a quarter wavelength strip transmission line 16 which has therein a resistor R2 and a capacitor C8 coupled to ground. The collector of the transistor Q1 is coupled by means of capacitor C12 to a quarter wavelength strip transmission line 18, one end of which is coupled directly to ground and the other end of which is coupled to ground through a variable capacitor C4. The strip transmission line 18 is coupled to a quarter wavelength strip transmission line 20 by means of capacitor C9. One end of the strip transmission line 20 is connected directly to ground while the other end is coupled to ground through variable capacitor C3. Finally, strip transmission line 20 is connected to terminal $P_{out}$ by means of capacitor C10.

In operation, the quarter wavelength strip line 10 and the quarter wavelength strip line 12 present a high impedance to the preselected signal frequency and present a short circuit to ground for all other frequencies. In this manner, quarter wavelength strip transmission lines 10 and 12 act exactly like the primary and secondary windings of transformer T1. In a like fashion, quarter wavelength strip transmission lines 18 and 20 also present a high impedance to the prechosen signal frequency desired to reach the output terminal $P_{out}$, and present a short circuit to ground for all other frequencies. Thus, strip transmission lines 18 and 20 act like the primary and secondary windings of the transformer T2. Additionally, quarter wavelength strip transmission lines 14 and 16 present a short circuit to ground for AC signals and thus serve to decouple the voltage sources V1 and V2 from the signal frequency. In this manner, they perform the same function as inductors L1 and L2 of the lumped circuit of FIG. 1.

Figure 3:
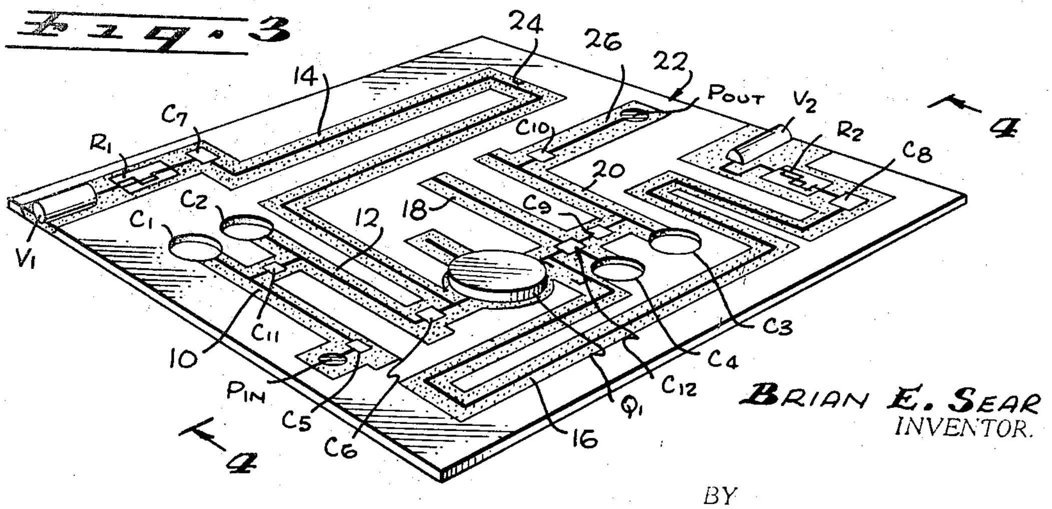
FIG. 3 is a perspective view of the RF amplifier of FIG. 2 using planar coaxial circuitry.

The distributed circuit of FIG. 2 is shown in FIG. 3 laid out according to the teachings of the present invention and the above-cited patent application. A metal base plate 22, generally made of aluminum, has a series of channels or grooves 24 (shown in FIG. 4) chemically or otherwise etched therein to accommodate the strip transmission lines and the various discrete components. The grooves are then filled with an insulating low dielectric constant material 26 which provides electrical isolation between the strip transmission lines and the various components and the metal base plate 22. In addition, various holes which have been drilled in the metal base plate 22 for the variable capacitors and the input and output terminals are also filled with the dielectric material 26.

In the next step of fabrication, DC connectors for voltage sources V1 and V2 are imbedded in the dielectric material 26 and smaller holds are drilled through the insulating material 26 filling the previously drilled holes for the variable capacitors and the input and output terminals. Strip transmission lines 10, 12, 14, 16, 18, and 20 are then formed or laid down over the insulating material 26 in the channels 24. At the same time, a metallic layer is placed on the walls of the various holes and are laid down for the emitter, base, and collector connections to the transistor Q1. All of the strip transmission lines and other metallic layers may be formed either by selective deposition (plating or vacuum evaporation) through masks or by a general deposition followed by selective etching. All of these techniques are well known in the art and no further discussion of them is believed necessary. To complete the circuit board as shown in FIG. 3, resistive material is laid down and selectively etched to form thin film resistors R1 and R2, ceramic chip capacitors C5 through C12 are placed on the circuit board, and transistor Q1 is attached to the emitter, base, and collector strips. It should be noted that each of the holes in the circuit board is preferably filled with a thin cylinder of conductive material which is connected to the strip transmission lines and insulated from the metal base plate 22.

A significant feature of the invention can now be seen in FIG. 3. The strip transmission lines 14 and 16 are required to be one quarter wavelength in length in order to act effectively as decouplers. With ordinary circuit board techniques, it would be necessary to extend the strip transmission lines 14 and 16 in a straight line so as to avoid electrical coupling between portions of the same transmission line. As is obvious from FIG. 3, a straight extension of strip transmission lines 14 and 16 would require that the circuit board be at least twice as large along both planar dimensions. Because of the effective shielding of the circuit board techniques described in the above-cited patent application, the strip transmission lines 14 and 16 can be folded back along themselves without fear of electrical coupling, and thus provide a more compact circuit board. Although it is not necessary for the embodiment shown in FIG. 3, the strip transmission lines 10, 12, 18, and 20 could likewise be folded back on themselves to provide in conjunction with capacitors C1–C4 folded quarter wavelength resonators.

Figure 4:
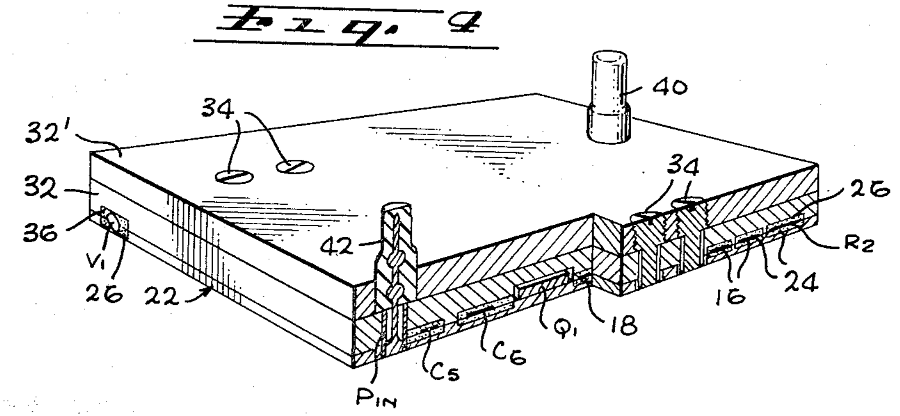
FIG. 4 is a partially cut away illustration of an RF amplifier embodying the circuitry of FIG. 2 and including the structure shown in FIG. 3 as taken in the direction of arrows 4—4 thereof; and FIGS. *5a*, *5b*, *5c*, *5d* and *5e* collectively illustrate the method of the present invention for producing the tuning capacitors.
Figure 5A:
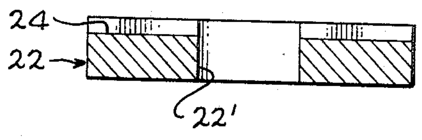
Figure 5B:
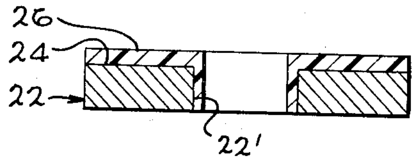
Figure 5C:
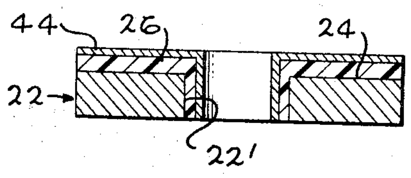
Figure 5E:
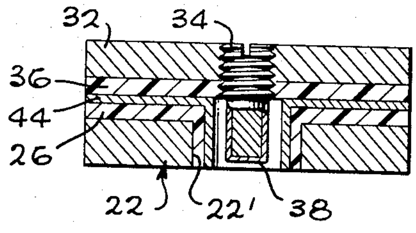
Figure 5D:
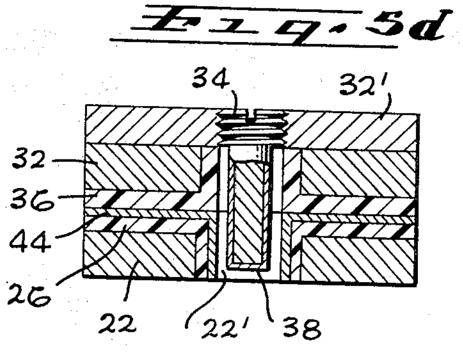

Referring now to FIG. 4, a partially cut away completed structure is illustrated embodying the planar circuitry of FIG. 3. As shown in FIG. 4, a metal plate 32 having corresponding grooves formed therein is placed upon the metal base plate 22. The metal plate 32 has the grooves therein likewise filled with an insulating material 36 and the remainder of the plate 32 is coated with a conductive bonding material, such as a metal loaded epoxy. In addition, a nonconductive epoxy is deposited upon material 36 in the grooves. Additionally, holes are formed in the plate 32 to receive pins for the input terminals $P_{in}$ and $P_{out}$ and the second plates of the variable capacitors C1 through C4 (the metallic cylinders forming the first plates). As with respect to metal base plate 22, the holes drilled in the plate 32 are filled with material 36 and then smaller holes are subsequently drilled through material 36. A second metal plate 32' is then bonded to metal plate 32. This metal plate 32' supports the second plate of the tuning capacitors C1 through C4 and the connection posts (and pins) 40 and 42 for the input and output terminals $P_{in}$ and $P_{out}$. The connector pins go through the insulated hole in metal plate 32 and contact the metal cylinder which forms the input terminal $P_{in}$ (or $P_{out}$). The metal plate 32' contains a series of holes therein with threaded surfaces into which the second plate 34 of the variable capacitors are seated. Additionally shown in FIG. 4, is the thin film resistor R2, the ceramic chip capacitors C5 and C6, the DC connector for voltage source VI, the etched channels 24 filled with dielectric material 26, and portions of the strip transmission lines 16 and 18.

The steps in the manufacture of the unique variable capacitor of the present invention is illustrated in more detail in FIG. 5. In FIG. *5a*, the metal base plate 22 is shown having grooves 24 formed therein and a hole 22' drilled therethrough. In FIG. *5b*, a layer of insulating material 26 is shown filling the grooves 24 and coating the annular wall of the hole 22'. In FIG. *5c*, a metallic layer 44 is shown deposited on the insulating material 26 and the reduced wall of the hole 22'. This metallic layer 44 functions both as the strip transmission line and also as the first plate of the variable capacitor. It is thus seen that the strip transmission line and the variable capacitor are intimately electrically coupled and the variable capacitor is formed integral with the circuitry of the circuit boards. In FIG. *5d*, the second plate 34 of the variable capacitor is placed in the hole 22'. The second plate 34 of the variable capacitor is shown supported by metallic plate 32' which, along with metallic plate 32 and insulating material 36, is bonded to metallic film 44, insulating material 26, and metallic base plate 22.

As explained previously, the metallic plate 32' has a hole formed therein along with the various grooves which hole and grooves are subsequently filled with insulating material 36; the filled hole is then drilled out to leave a sleeve of insulating material in the hole in metallic plate 32. The insulating sleeve could likewise be formed in plate 22. Metallic plate 32' which has threaded holes formed therein in the positions of the variable capacitors, is then bonded by means of a conductive bonding material to metallic plate 32, which is subsequently bonded to metallic plate 22. It should be noted that metallic layer 44 and the insulating materials 26 and 36 are found only in the vicinity of the grooves and the drilled holes, and the remainder of the structure is electrically coupled.

After the entire stucture has been bonded together, the second plate 34 of the variable capacitor is placed in the hole 22'. This second plate 34 consists of a metallic plug with a thin dielectric sleeve 38 coating the portion extending down into the metallic sleeve formed by the metallic layer 44. The top part of the second plate 34 of the variable capacitor is threaded so as to mate with the threaded hole in the metallic plate 32'. It is thus apparent that the capacitance of the variable capacitor is easily adjusted by merely varying the depth of insertion of the second plate 34 into the hole 22'. It should be noted that the insulating sleeves are necessary only where the plates 22 and 32 are conductive. If such plates are nonconductive, metallic layer 44 could be placed directly in the walls of the holes in the formation of the variable capacitor.

In FIG. *5e*, a step in the manufacture of the variable capacitor alternate to that shown in FIG. *5d* is illustrated. As is apparent from an examination of FIG. 4, the metallic plate 32' is only necessary where there are tall internal components, such as transistor Q1, or where it is desirable to have the posts for the input and output terminals connected to a separate metallic plate. However, where the components are relatively thin, such as the thin film resistors or the ceramic chip capacitors, only metallic plate 32 is necessary in the construction of the circuit board. Thus, in FIG. *5e*, metallic plate 32 alone is shown having a threaded hole formed therethrough along with the grooves corresponding to those in metallic base plate 22. As shown in FIG. *5e*, these grooves are also filled with an insulating material 36. The metallic plate 32 is then conductively bonded to the metallic plate 22 to form the structure shown in FIG. *5e*. As before, the second plate 34 of the variable capacitors is screwed down into the metallic plate 32 and the hole 22' to form the variable capacitor.

Having thus described the invention and the method of manufacture thereof, it is apparent that numerous modifications and departures may be made therefrom by those skilled in the art, all of which fall within the scope contemplated by the invention. Consequently, the invention herein described is to be construed to be limited only by the spirit and scope of the appended claims.

The embodiments of the invention in which an exclusive property or privilege is claimed are defined as follows:

1. A variable capacitor formed integral with a circuit board comprising:

a first conductive plate having a hole formed therein;

a layer of nonconductive material formed on the wall of said hole;

a layer of conductive material formed on said layer of nonconductive material;

a second conductive plate having a threaded hole formed therein and placed in registration with said hole in said first conductive plate; and a metallic plug inserted in said hole and said threaded hole, said metallic plug having a threaded upper portion and a dielectric-coated lower portion.

2. A variable capacitor comprising:

a cylinder of conductive material positioned in a first plate; and a metallic plug having a threaded upper portion and a dielectric-coated lower portion, said upper portion being positioned in a threaded hole in a second plate adjacent to said first plate and said lower portion being positioned in said cylinder.

3. The variable capacitor of claim 2 wherein said first plate is composed of a conductive material and said cylinder of conductive material is surrounded by a cylinder of nonconductive material positioned in said first plate.

4. The variable capacitor of claim 2 wherein said second plate is composed of a conductive material.

5. A quarter wavelength resonator for use in a high frequency circuit board comprising:

a quarter wavelength circuit line positioned in insulated grooves formed in first and second adjacent conductive plates; and a variable capacitor coupled thereto, said capacitor including a cylinder of conductive material connected to said circuit line and positioned in said first conductive plate and insulated therefrom by a cylinder of nonconductive material, and a metallic plug having a threaded upper portion positioned in a threaded hole in said second plate and a dielectric-coated lower portion positioned in said cylinder of conductive material.

6. In a structure forming an electronic circuit and including a conductive plate, means forming a variable capacitor, said means comprising:

a hole defined in said plate;

a layer of dielectric material supported on at least a portion of the wall of said hole;

a layer of conductive material supported on said layer of dielectric material and insulated thereby from said conductive plate;

a conductive plug having a first portion adapted to be electrically connected to said plate and a second portion adapted to be supported in opposed relationship to and insulated from said layer of conductive material; and means supporting said plug in said hole with said first portion thereof electrically connected to said plate and with said second portion thereof movable with respect to said conductive layer.

7. The combination of claim 6 including an elongated conductor supported within the plane of said plate but electrically insulated therefrom; and means electrically connecting said elongated conductor to said layer of conductive material.

8. A compact high density structure forming an electronic circuit for operating on signals within a selected high frequency range which circuit includes a reactance component, said structure comprising:

at least two electrically conductive plates secured together to define a composite electrically conductive board structure;

a reactance component carried by said conductive board structure, said reactance component comprised of:

(1) an elongated channel extending through and substantially surrounded by said board structure;

(2) dielectric material substantially filling said channel; and (3) a single elongated planar electrical conductor having an effective electrical length substantially equal to an odd multiple of quarter wavelengths of a signal in said selected frequency range supported in said channel and electrically insulated from said conductive board structure by said dielectric material; and a variable capacitor formed within opposed openings provided in said conductive plates and comprising first and second capacitor plates mounted in said openings so as to permit relative movement therebetween, one of said capacitor plates being electrically connected to said single elongated planar electrical conductor and insulated from said conductive plates and the other of said capacitor plates being electrically connected to said conductive plates and insulated from said single elongated planar electrical conductor.

9. The structure of claim 8 wherein said circuit includes an active component;

a recess formed in and substantially surrounded by said conductive board structure;

dielectric means supporting said active component in said recess and electrically insulating it from said conductive board structure; and means connecting said reactance component conductor to said active component.

10. The structure of claim 8 wherein said channel is elongated in the plane of said conductive plates and extends substantially equally into said conductive plates from opposed surfaces thereof.

11. A compact high density structure forming an electronic circuit for operating on signals within a selected high frequency range which circuit includes a reactance component, said structure comprising:

at least two electrically conductive plates secured together to define a composite electrically conductive board structure;

a reactance component carried by said conductive board structure, said reactance component comprised of:

(1) an elongated channel extending through and substantially surrounded by said board structure;

(2) dielectric material substantially filling said channel; and (3) a single elongated planar electrical conductor having an effective electrical length substantially equal to an odd multiple of quarter wavelengths of a signal in said selected frequency range supported in said channel and electrically insulated from said conductive board structure by said dielectric material; and variable capacitance means connected to said elongated electrical conductor and including:

a hole defined in said composite electrically conductive board structure;

a layer of dielectric material supported on at least a portion of the wall of said hole;

a layer of conductive material supported on said layer of dielectric material and insulated thereby from said conductive board structure;

a conductive plug having a first portion adapted to be electrically connected to said board structure and a second portion adapted to be supported in opposed relationship to and insulated from said layer of conductive material; and means supporting said plug in said hole with said first portion thereof electrically connected to said board structure and with said second portion thereof movable with respect to said conductive layer.

12. A compact high density structure forming an electronic circuit for operating on signals within a selected high frequency range which circuit includes a reactance component, said structure comprising:

at least two electrically conductive plates secured together to define a composite electrically conductive board structure; and a reactance component carried by said conductive board structure, said reactance component comprised of:

(1) an elongated channel extending through and substantially surrounded by said board structure, said channel following a path which folds back on itself a plurality of times;

(2) dielectric material substantially filling said channel; and (3) a single elongated planar electrical conductor having an effective electrical length substantially equal to an odd multiple of quarter wavelengths of a signal in said selected frequency range supported in said channel and electrically insulated from said conductive board structure by said dielectric material.

References Cited

UNITED STATES PATENTS

| | | | |
|---|---|---|---|
| 2,895,020 | 7/1959 | Ksiazek | 330—66 |
| 2,933,704 | 4/1960 | Janssen et al. | 333—84 X |
| 3,051,844 | 8/1962 | Beam et al. | 307—88 |
| 3,142,783 | 7/1964 | Warren | 317—101 |
| 3,189,823 | 6/1965 | Mitchell | 325—126 |
| 3,259,860 | 7/1966 | Ayer | 333—84 |
| 3,345,589 | 10/1967 | Di Piazza | 333—73 |
| 3,351,816 | 11/1967 | Sear et al. | 333—84 X |

OTHER REFERENCES

"On the Optimum Length for Transmission Lines Used as Circuit Elements" Salzberg Publication No. ST–93, December 1937, Research and Engineering Department, RCA Radiotron Div., RCA Manufacturing Co., Inc., Harrison, N.J.; Cover and pages 1561–1564.

ELI LIEBERMAN, Primary Examiner

M. NUSSBAUM, Assistant Examiner

U.S. Cl. X.R.

174—68.5; 317—101, 249; 333—82, 84